(12) United States Patent
Kuramoto et al.

(10) Patent No.: US 11,114,583 B2
(45) Date of Patent: Sep. 7, 2021

(54) LIGHT EMITTING DEVICE ENCAPSULATED ABOVE ELECTRODES

(71) Applicant: NICHIA CORPORATION, Anan (JP)

(72) Inventors: Masafumi Kuramoto, Tokushima (JP); Daisuke Iwakura, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/705,235

(22) Filed: Dec. 6, 2019

(65) Prior Publication Data

US 2020/0111932 A1 Apr. 9, 2020

Related U.S. Application Data

(62) Division of application No. 15/851,636, filed on Dec. 21, 2017, now Pat. No. 10,535,794.

(30) Foreign Application Priority Data

Dec. 27, 2016 (JP) .............................. JP2016-252186

(51) Int. Cl.
*H01L 33/00* (2010.01)
*H01L 33/50* (2010.01)
(Continued)

(52) U.S. Cl.
CPC .......... *H01L 33/0093* (2020.05); *H01L 24/19* (2013.01); *H01L 24/96* (2013.01);
(Continued)

(58) Field of Classification Search
CPC ... H01L 33/0079; H01L 24/96; H01L 33/502; H01L 33/60; H01L 33/62;
(Continued)

(56) References Cited

U.S. PATENT DOCUMENTS 8,294,276 B1* 10/2012 Kim ...................... H01L 21/561
257/775
2006/0131602 A1* 6/2006 Ouderkirk ............. H01L 33/642
257/100
(Continued)

FOREIGN PATENT DOCUMENTS

JP 08-298345 11/1996
JP 2000-058924 2/2000
(Continued)

OTHER PUBLICATIONS

Restriction requirement issued by the U.S. Patent and Trademark Office for the parent U.S. Appl. No. 15/851,636, filed Jun. 26, 2018.
(Continued)

*Primary Examiner* — Peter Bradford
(74) *Attorney, Agent, or Firm* — Mori & Ward, LLP

(57) ABSTRACT

A light emitting element includes a light emitting element having a first face on which a first electrode and a second electrode are provided. A wavelength converting material covers a whole of the light emitting element except for the first face such that a surface of the wavelength converting material and the first face constitute a substantially flat plane. A first electrically conductive material is provided on the first face and the surface of the wavelength converting material to be electrically connected to the first electrode. A second electrically conductive material is provided on the first face and the surface of the wavelength converting material to be electrically connected to the second electrode. An insulating member is disposed on the first electrically conductive material, the second electrically conductive material, and the first face between the first electrode and the second electrode.

22 Claims, 10 Drawing Sheets

(51) Int. Cl.
*H01L 33/60* (2010.01)
*H01L 33/62* (2010.01)
*H01L 23/00* (2006.01)
*H01L 21/56* (2006.01)

(52) U.S. Cl.
CPC .......... *H01L 33/502* (2013.01); *H01L 33/505* (2013.01); *H01L 33/508* (2013.01); *H01L 33/60* (2013.01); *H01L 33/62* (2013.01); *H01L 21/561* (2013.01); *H01L 21/568* (2013.01); *H01L 33/0095* (2013.01); *H01L 2224/95001* (2013.01); *H01L 2924/12041* (2013.01); *H01L 2933/0041* (2013.01); *H01L 2933/0058* (2013.01); *H01L 2933/0066* (2013.01)

(58) Field of Classification Search
CPC . H01L 2224/95001; H01L 2924/12041; H01L 2933/0041; H01L 2933/0058; H01L 2933/0066
See application file for complete search history.

(56) References Cited

U.S. PATENT DOCUMENTS

| | | | | |
|---|---|---|---|---|
| 2012/0008287 | A1* | 1/2012 | Kim | H01L 24/96 361/736 |
| 2012/0193667 | A1* | 8/2012 | Choi | C09K 11/025 257/98 |
| 2012/0302124 | A1* | 11/2012 | Imazu | H01L 33/486 445/58 |
| 2013/0001633 | A1* | 1/2013 | Imai | H01L 33/60 257/99 |
| 2013/0228915 | A1* | 9/2013 | Chang | H01L 21/78 257/734 |
| 2014/0335635 | A1* | 11/2014 | Venk | H05K 3/4069 438/27 |
| 2015/0008467 | A1 | 1/2015 | Sawada et al. | |
| 2015/0221830 | A1* | 8/2015 | Kim | H01L 33/62 257/98 |
| 2015/0279778 | A1* | 10/2015 | Camacho | H01L 21/76877 257/737 |
| 2015/0280093 | A1 | 10/2015 | Tomita et al. | |
| 2015/0311405 | A1* | 10/2015 | Oyamada | H01L 33/60 257/98 |
| 2015/0325748 | A1* | 11/2015 | Ting | H01L 33/38 257/98 |
| 2015/0362136 | A1 | 12/2015 | Bancken et al. | |
| 2016/0064604 | A1* | 3/2016 | Lin | H01L 33/502 257/98 |
| 2016/0181689 | A1* | 6/2016 | Bishop | H01Q 1/40 343/700 MS |
| 2017/0263833 | A1* | 9/2017 | Chiu | H01L 33/62 |

FOREIGN PATENT DOCUMENTS

| | | |
|---|---|---|
| JP | 2005-327786 | 11/2005 |
| JP | 2011-233552 | 11/2011 |
| JP | 2012-039013 | 2/2012 |
| JP | 2012-138454 | 7/2012 |
| JP | 2012-253223 | 12/2012 |
| JP | 2014-139979 | 7/2014 |
| JP | 2016-513335 | 5/2016 |
| WO | WO 2013/121708 | 8/2013 |
| WO | WO 2014/064871 | 5/2014 |

OTHER PUBLICATIONS

Office Action with Form PTO-892 Notice of References Cited issued by the U.S. Patent and Trademark Office for the parent U.S. Appl. No. 15/851,636, filed Oct. 9, 2018.

Office Action with Form PTO-892 Notice of References Cited issued by the U.S. Patent and Trademark Office for the parent U.S. Appl. No. 15/851,636, filed May 15, 2019.

Notice of Allowance with Form PTO-892 Notice of References Cited issued by the United States Patent and Trademark Office for the parent U.S. Appl. No. 15/851,636, filed Sep. 11, 2019.

* cited by examiner ial view of the light emitting device related to the first
LIGHT EMITTING DEVICE ENCAPSULATED ABOVE ELECTRODES

CROSS-REFERENCE TO RELATED APPLICATIONS

The present application is a divisional application of the U.S. patent application Ser. No. 15/851,636, filed Dec. 21, 2017, which claims priority under 35 U.S.C. § 119 to Japanese Patent Application No. 2016-252186, filed Dec. 27, 2016. The contents of these applications are incorporated herein by reference in their entirety.

BACKGROUND

Field of the Invention

The present disclosure relates to a light emitting device.

Discussion of the Background

Surface mount type light emitting devices employing light emitting elements are compact, have high energy efficiency and bright color emissions. Since the light emitting elements are semiconductor elements, they do not burn out. Furthermore, they have good initial drive properties, and are resistant to vibration and repeated ON/OFF operations. Because of such excellent properties, light emitting devices employing light emitting elements, such as light emitting diodes (LEDs), laser diodes (LDs), or the like, have been utilized as various light sources. In recent years, price reduction trends in the light emitting elements have progressed rapidly as their popularity and output increase.

Japanese Patent Application Publication No. H08-298345 discloses a chip-type light emitting diode which includes a pair of electrodes disposed on the upper face of an insulating substrate, a light emitting diode element mounted on the surface of one of the electrodes, wherein the light emitting diode element and the surface of the other electrode are connected by wire bonding using a fine metal wire, and the light emitting diode element and the fine metal wire are sealed with a light transmissive resin. The insulating substrate is disposed on the rear surface side of the pair of electrodes. It discloses that the electrodes have nickel plating or gold plating over a copper foil.

Japanese Patent Application Publication No. 2000-058924 discloses forming a pair of electrodes on a substrate made of a thin metal sheet, and placing a light emitting diode element on one of the electrodes.

Japanese Patent Application Publication No. 2012-039013 discloses steps of arranging LEDs in a regular sequence on a pressure sensitive adhesive sheet, applying and semi-curing a ceramic ink in which phosphor particles are dispersed, separating the LEDs by grinding the ceramic ink, and fully curing the ceramic ink by heating the separated LEDs.

Japanese Patent Application Publication No. 2012-138454 discloses a semiconductor light emitting device in which a white reflective member, a LED element, a phosphor layer, and glass are stacked on connection electrodes.

SUMMARY

According to one aspect of the present invention, a light emitting element includes a light emitting element, a wavelength converting material, a first electrically conductive material, a second electrically conductive material, and an insulating member. The light emitting element has a first face on which a first electrode and a second electrode are provided. The wavelength converting material covers a whole of the light emitting element except for the first face such that a surface of the wavelength converting material and the first face constitute a substantially flat plane. The first electrically conductive material is provided on the first face and the surface of the wavelength converting material to be electrically connected to the first electrode. The second electrically conductive material is provided on the first face and the surface of the wavelength converting material to be electrically connected to the second electrode. The insulating member is disposed on the first electrically conductive material, the second electrically conductive material, and the first face between the first electrode and the second electrode.

According to another aspect of the present invention, a light emitting element includes a light emitting element, a wavelength converting material, a first electrically conductive material, a second electrically conductive material, and an insulating member. The light emitting element having a first face on which a first electrode and a second electrode are provided. The wavelength converting material covers a whole of the light emitting element except for the first face such that a surface of the wavelength converting material and the first face constitute a substantially flat plane. The first electrically conductive material is provided on the surface of the wavelength converting material outside the first face to be electrically connected to the first electrode. The second electrically conductive material is provided on the surface of the wavelength converting material outside the first face to be electrically connected to the second electrode. The insulating member is disposed on the first electrically conductive material, the second electrically conductive material, and the first face between the first electrode and the second electrode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
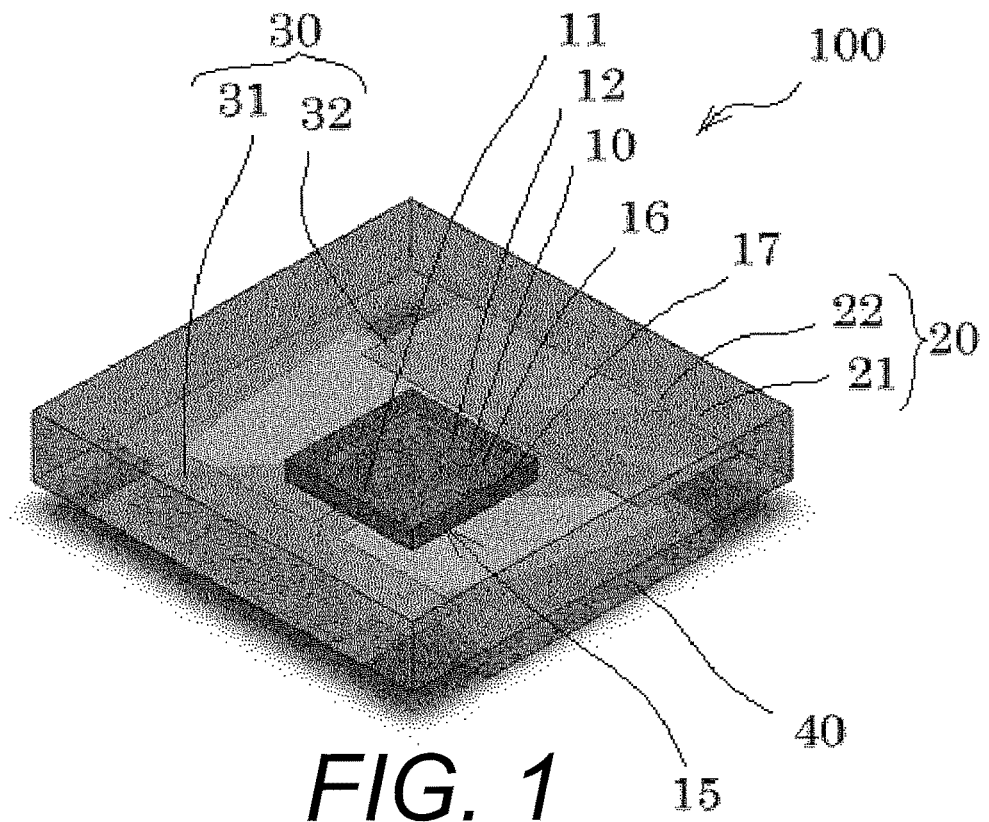
FIG. 1 is a schematic perspective view of the light emitting device related to a first embodiment.

The embodiments will now be described with reference to the accompanying drawings, wherein like reference numerals designate corresponding or identical elements throughout the various drawings.

The light emitting devices and methods for manufacturing the same related to certain embodiments will be explained below. The present invention, however, is not limited to the embodiments or examples.

The drawings referenced in the following explanations are schematic representations of the embodiments, and the sizes of, or intervals and positional relationships between the members might occasionally be exaggerated or partially omitted. For example, the sizes or intervals of members might not match among the front, plan, and cross-sectional views on occasion. In the explanations below, moreover, the same designations and reference numerals denote the same members or those having a similar nature, the detailed explanations of which will be omitted when appropriate.

In the light emitting devices and methods for manufacturing the same related to the embodiments, the directions or positions indicated by the terms, such as "upper," "lower," "right," "left," might switch depending on the situation. These terms, such as "upper" and "lower" are used to show the positions of the constituent elements relative to one another in the drawings referred to for the purpose of explanation, and they are not intended to show the absolute positions unless otherwise specifically noted. In the explanations of the light emitting devices and the methods for manufacturing the same, in particular, the upper/lower or left/right positional relationship might switch back and forth.

First Embodiment

Figure 2:
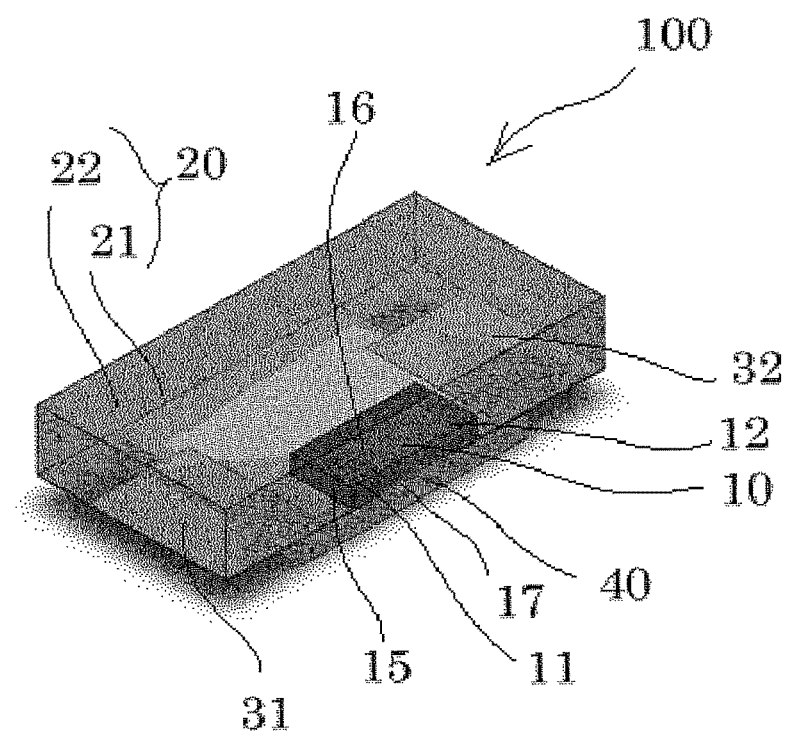
FIG. 2 is a schematic perspective cross-sectional view of the light emitting device related to the first embodiment.
Figure 3:
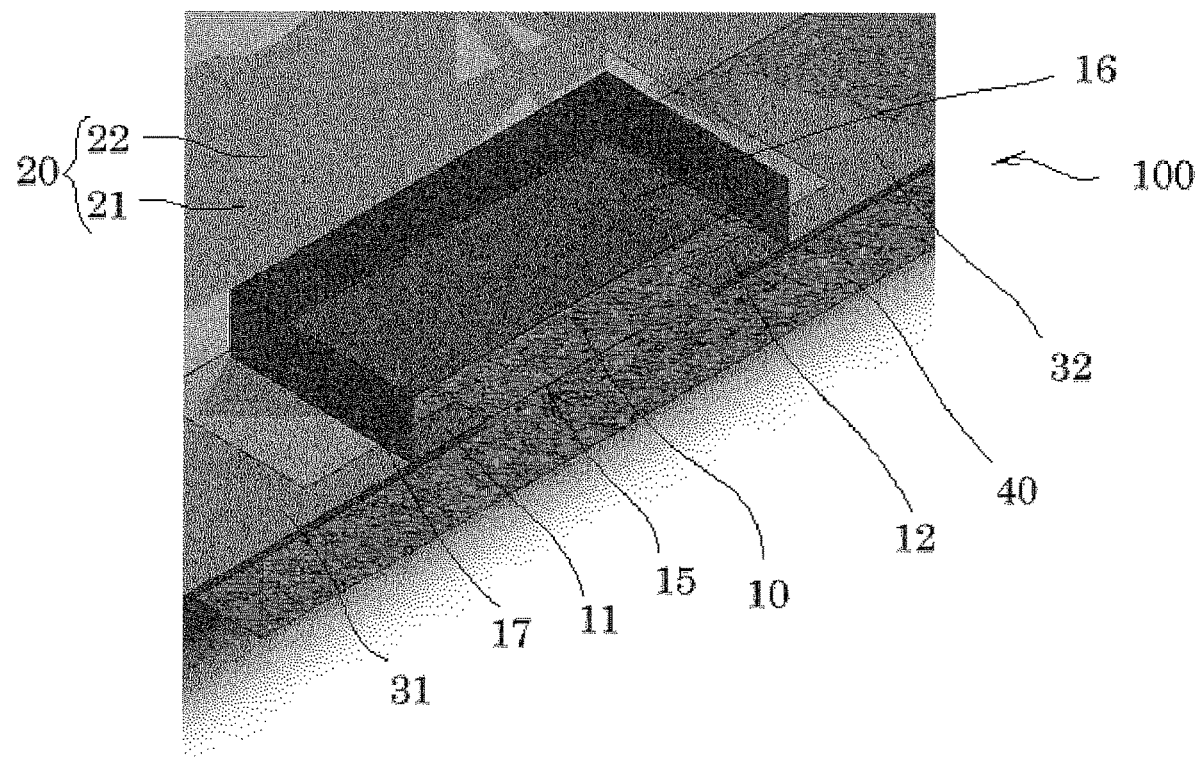
FIG. 3 is an enlarged schematic perspective cross-sectional view of the light emitting device related to the first embodiment.

The light emitting device related to a first embodiment will be explained with reference to the drawings. FIG. 1 is a schematic perspective view of the light emitting device related to the first embodiment. FIG. 2 is a schematic perspective cross-sectional view of the light emitting device related to the first embodiment. FIG. 3 is an enlarged schematic perspective cross-sectional view of the light emitting device related to the first embodiment. The side on which the first electrode and the second electrode of the light emitting element are disposed is referred to as the lower face side of the light emitting element and the light emitting device, and the other side is referred to as the upper side.

The light emitting device 100 includes a light emitting element 10, a wavelength converting member (a wavelength converting material) 20, a first conductive member (a first electrically conductive material) 31, a second conductive member (a second electrically conductive material) 32, and an insulating member 40. The first conductive member 31 and the second conductive member 32 are collectively referred to as the conductive members 30 on occasion. Moreover, the explanation is given using the first conductive member 31 as an example, but the second conductive member 32 is assumed to have a similar construction and effects unless otherwise specifically noted.

The light emitting element 10 includes a first electrode 11 and a second electrode 12. The light emitting element 10 has a first face 15, a second face 16 which opposes the first face 15, and lateral faces 17. Here, since a rectangular parallelepiped light emitting element 10 is described, the light emitting element 10 has four lateral faces 17, which are contiguous with the first face 15 and the second face 16. The first electrode 11 and the second electrode 12 are disposed on the first face 15.

The wavelength converting member 20 covers the second face 16 and the lateral faces 17 of the light emitting element 10, but does not cover the first face 15. The first face 15 of the light emitting element 10 is in direct contact with the conductive members 30 and the insulating member 40. The first face 15 of the light emitting element 10 and [the lower face of] the wavelength converting member 20 are coplanar. "Coplanar" herein means the height difference between the first face 15 and the lower face of the wavelength converting member 20 is 5 m at most, preferably 1 m at most. Minimizing the height difference between the first face 15 and the lower face of the wavelength converting member 20 can make it difficult for the wavelength converting member 20 to be formed on the first face 15 as well as reducing the height difference between the conductive members 30.

The first conductive member 31 is electrically connected to the first electrode 11, in contact with the wavelength converting member 20, and formed on the first face 15. The second conductive member 32 is electrically connected to the second electrode 12, in contact with the wavelength converting member 20, and formed on the first face 15. The conductive members 30 cover at least 30%, preferably at least 50%, more preferably at least 70%, of the lower face of the wavelength converting member 20. This allows the heat generated from the light emitting element 10 and the wavelength converting member 20 to be readily dissipated through the conductive members 30. Moreover, using a highly reflective material for the conductive members 30 allows the light released from the light emitting element 10 and the wavelength converting member 20 to be efficiently reflected upwards. Since the conductive members 30 are thin films formed by using a material in a paste or melted particle form to coat the wavelength converting member 20, the overall thickness of the light emitting device 100 can be reduced.

The insulating member 40 is formed on at least part of the first electrode 11, at least part of the second electrode 12, and the first face 15 between the first electrode 11 and the second electrode 12. Adjusting the thickness of the insulating member 40 can reduce the inclination of the light emitting device 100 during soldering or the like while maintaining the heat dissipation properties.

By employing the components described above, a thin-type light emitting device 100 having good heat dissipation properties can be provided.

The light emitting element 10, having a first face 15 equipped with the first electrode 11 and the second electrode 12 emits light primarily from the second face 16. The wavelength converting member 20 is disposed on the second face and the four lateral faces of the light emitting element 10.

The upper face area of the wavelength converting member 20, although not specifically limited, is preferably sized to allow the light from the light emitting element 10 to be efficiently released. For example, the upper face area of the wavelength converting member 20 can be 1.5 to 20 times, preferably 2 to 10 times, the surface area of the second face 16 of the light emitting element 10. No restrictions apply to the thickness of the wavelength converting member 20 so long as it is larger than the thickness of the light emitting element 10, but is preferably 0.2 mm to 1.0 mm, more preferably 0.3 mm to 0.6 mm. This is because the color tone can be varied by changing the thickness of the wavelength converting member 20. The upper face of the wavelength converting member 20 is preferably flat. This can reduce the overall thickness of the light emitting device 100. However, the upper face of the wavelength converting member 20 can alternatively be given a convex lens shape. This can condense the light from the light emitting element 1. The convex lens shape can also be formed with a reduced height.

The wavelength converting member 20 is a thin sheet forming substantially a rectangular parallelepiped. The wavelength converting member 20 can have a polygonal shape in a plan view, such as a square, rectangle, triangle, hexagon, or the like.

For the wavelength converting member 20, a light transmissive member 22 in which particles of a phosphor 21 are dispersed can be used. However, the phosphor 21 alone can be used instead, without a light transmissive member.

The first conductive member 31 and the second conductive member 32 are arranged on the lower face side of the wavelength converting member 20. The first conductive member 31 and the second conductive member 32 may have the same area and shape, but may have different areas or shapes so that the anode and the cathode can be differentiated. A cathode mark may be provided at a certain location of the conductive members 30 instead.

The first conductive member 31 and the second conductive member 32 can be formed by using the same material, and under substantially the same conditions. The thicknesses of the first conductive member 31 and the second conductive member 32 are preferably substantially equal. There are no restrictions for the thicknesses of the first conductive member 31 and the second conductive member 32, but are preferably about 0.05 mm to 0.1 mm. This can improve the heat dissipation properties. Moreover, setting the thicknesses of the first conductive member 31 and the second conductive member 32 to 0.001 mm to 0.05 mm can reduce the overall height of the light emitting device 100.

The first conductive member 31 and the second conductive member 32 each cover part of the first face 15 of the light emitting element 10. For example, the first conductive member 31 and the second conductive member 32 each cover two fifths of the first face 15 of the light emitting element 10. In the length of the first face 15 in the direction that crosses the first electrode 11 and the second electrode 12, the distance between the first electrode 11 and the second electrode 12 is set to one fifth of the total length of the light emitting element 10. The dimension of the first conductive member 31 or the second conductive member 32 in the direction perpendicular to the direction that crosses the first electrode 11 and the second electrode 12 is not specifically limited, and the first conductive member 31 and the second conductive member 32 may be formed to entirely cover the first electrode 11 and the second electrode 12, respectively. Alternatively, the first conductive member 31 and the second conductive member 32 may be formed to cover one half, one quarter, or the like of the first electrode 11 and the second electrode 12, respectively. Increasing the contact area between the first electrode 11 and the first conductive member 31 can improve the heat dissipation properties. Furthermore, reducing the contact area between the first electrode 11 and the first conductive member 31 can increase the reflection achieved by the insulating member 40.

The distance between the first conductive member 31 and the second conductive member 32 can be any as long as it causes no short circuits, for example, at least 1 mm, more preferably at least 0.1 mm.

In a plan view, the first conductive member 31 and the second conductive member 32 are formed on the outside of the light emitting element. This can increase the distance between the first conductive member 31 and the second conductive member 32 in the regions to be connected to external electrodes, thereby preventing short circuits. This can also increase the sizes of the first conductive member 31 and the second conductive member 32, thereby increasing the heat dissipation efficiency of the light emitting device 100.

The first conductive member 31 and the second conductive member 32 are each exposed along the side closer to the perimeter than the insulating member 40 in a rear view. Since the first conductive member 31 will be connected to an external electrode, the first conductive member 31 is exposed from the insulating member 40 on the rear face side of the light emitting device 100. On the rear face side of the light emitting device 100, the first conductive member 31 and the second conductive member 32 are preferably spaced apart. This is to prevent short circuits.

The insulating member 40 prevents the first conductive member 31 and the second conductive member 32 from having a short circuit, and increases the reflectance of the light emitting element 10. This is because the insulating member 40 provided between the first conductive member 31 and the second conductive member 32 can reflect the light exiting from the lower face of the light emitting element 10 back towards the upper face side.

It is preferable to use a material for the insulating member 40 that has a high reflectance relative to the light from the light emitting element 10 and the light from the wavelength converting member 20. The reflectance of the insulating member 40, in the visible spectrum, at least 50%, preferably at least 70%, more preferably at least 80%. For example, a reflectance of at least 70% in the emission wavelengths of the light emitting element 10.

For the insulating member 40, a highly thermally conductive material is preferably used. Conducting the heat released from the light emitting element 10 and the wavelength converting member 20 to the conductive members 30, the mounting substrate, the external electrodes, or the like can increase the heat transfer from the light emitting device 100. The thermal conductivity of the insulating member 40 is at least 1 W/mK, more preferably 2 to 3 W/mK. Imparting a thermal conductivity in excess of 3 W/mK to the insulating member 40 might be damaging to the insulating properties.

The surface area of the insulating member 40 is preferably larger than the surface area of the light emitting element 10. This allows the light released from the lower face of the light emitting element 10 to be efficiently reflected towards the upper face. The surface area of the insulating member 40 is at least 30%, preferably at least 50%, more preferably at least 70% of the surface area of the wavelength converting member 20. However, it is preferable for the insulating member 40 to not extend beyond the lower face of the wavelength converting member 20.

The insulating member 40 can increase the distance between the first conductive member 31 and the second conductive member 32 in a rear view.

The thickness of the insulating member 40 is not specifically limited, but is preferably 0.05 mm to 0.5 mm, more preferably 0.1 mm to 0.3 mm. Providing the insulating member 40 with a large thickness allows the heat to escape laterally from the light emitting device, thereby improving heat dissipation. When mounting the light emitting device 100 on a mounting substrate using solder or the like, moreover, the solder or the like can be accumulated between the mounting substrate and the conductive members 30 to the extent that is equivalent to the height of the insulating member 40. This can control the tilting of the light emitting device 100 when using solder, or reducing the occurrence of solder ball defects.

On the other hand, providing the insulating member 40 with a small thickness can reduce the overall thickness of the light emitting device 100.

Second Embodiment

Figure 4:
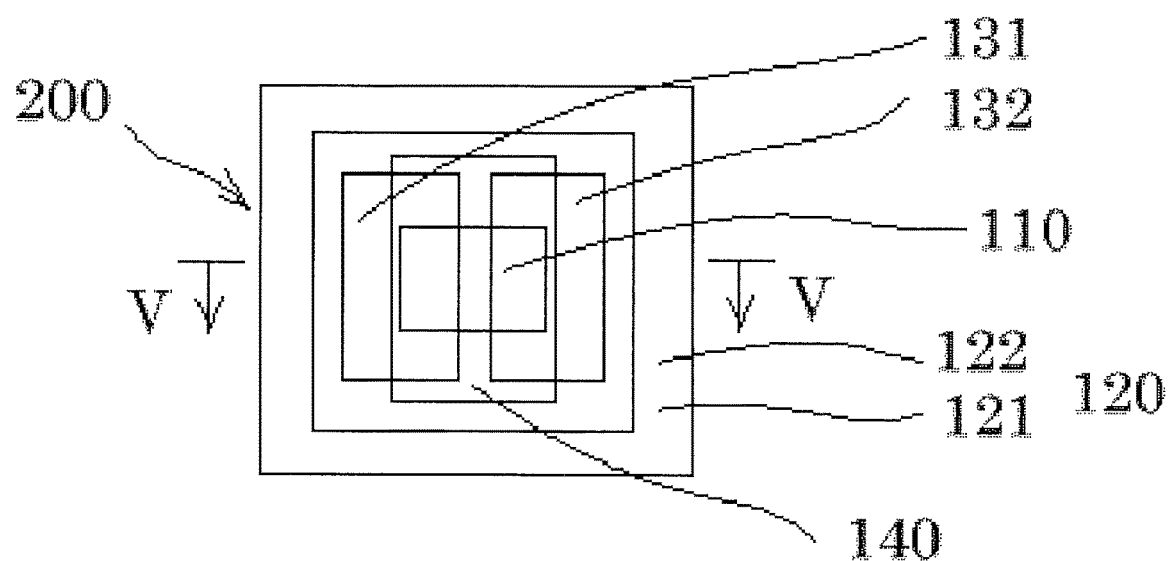
FIG. 4 is a schematic plan view of the light emitting device related to a second embodiment.
Figure 5:
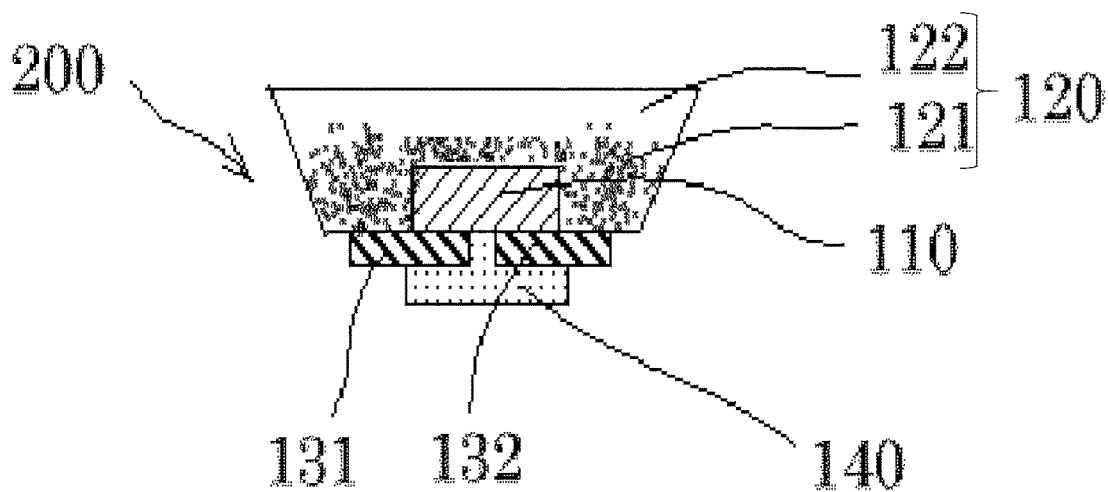
FIG. 5 is a schematic cross-sectional view of the light emitting device related to the second embodiment.

The light emitting device related to a second embodiment will be explained with reference to the drawings. FIG. 4 is a schematic plan view of the light emitting device related to the second embodiment. FIG. 5 is a schematic cross-sectional view of the light emitting device related to the second embodiment. FIG. 5 is a sectional view taken along line V-V in FIG. 4. The light emitting device according to the second embodiment employs substantially the same construction as that of the first embodiment except for having a different wavelength converting member. The explanations for the components that are substantially the same as those of the light emitting device of the first embodiment will be omitted when appropriate.

The light emitting device 200 includes a light emitting element 110, a wavelength converting member 120, a first conductive member 131, a second conductive member 132, and an insulating member 140. The wavelength converting member 120 forms an inverted trapezoidal shape. In other words, the upper face area of the wavelength converting member 120 is larger than the lower face area. The lateral faces of the wavelength converting member 120 are oblique upward and outward. This allows the light emitted laterally from the light emitting element 110 to irradiate and be reflected upwards by the lateral faces of the wavelength converting member 120, thereby increasing the amount of light released from the top of the light emitting device 200.

The wavelength converting member 120 is a light transmissive member 122 in which particles of a phosphor 121 are dispersed. The concentration of the phosphor 121 on the lower face side of the wavelength converting member 120 is higher than the concentration of the phosphor 121 on the upper face side. For example, a portion of the wavelength converting member 120 on the upper face side can be formed with a transmissive member 122 alone. This allows the generated heat from the phosphor 121 to be efficiently transferred to the first conductive member 131, the second conductive member 132, and the insulating member 140. Furthermore, since this reduces the opportunities of the light reflected by the interface between the upper face of the wavelength converting member 120 and the air to be scattered and return to the interior of the wavelength converting member 120, the amount of light released from the top of the light emitting device 200 can be further increased.

Third Embodiment

Figure 6:
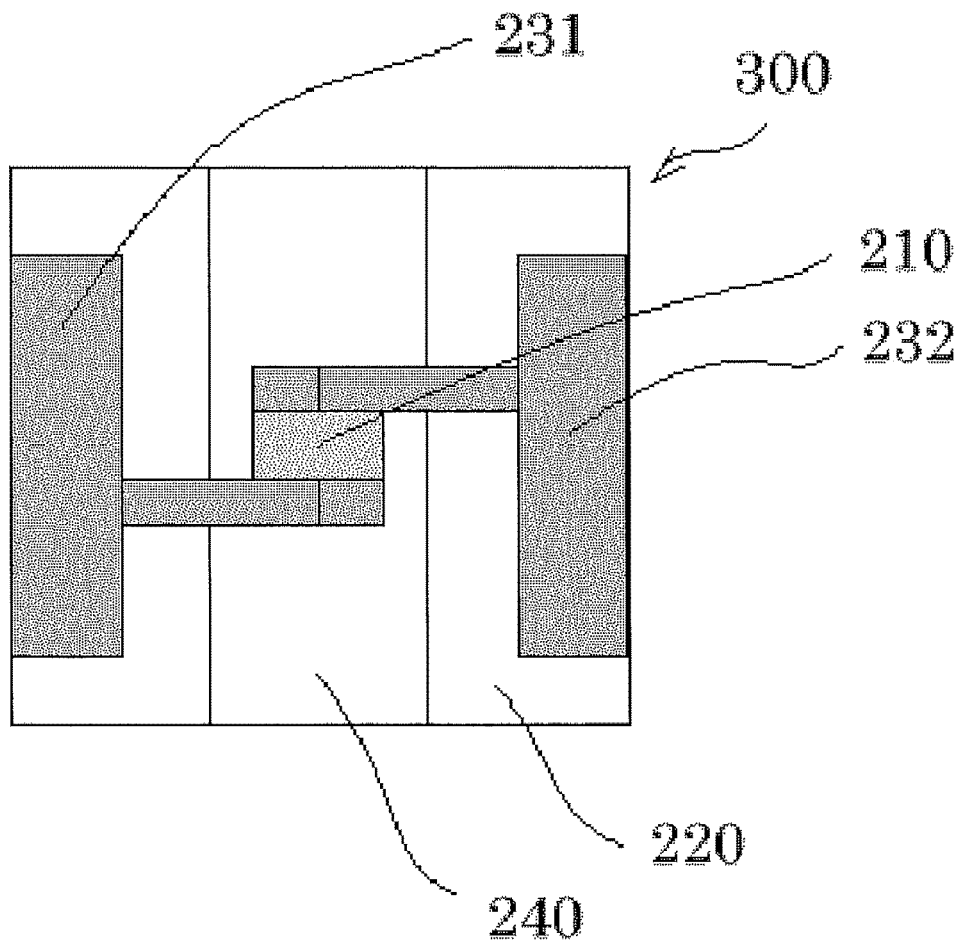
FIG. 6 is a schematic rear view of the light emitting device related to a third embodiment.

The light emitting device related to a third embodiment will be explained with reference to the drawing. FIG. 6 is a schematic rear view of the light emitting device related to the third embodiment. The light emitting device according to the third embodiment employs substantially the same construction as that of the first embodiment except for having different first conductive member, second conductive member, and insulating member. The explanations for the components that are substantially the same as those of the light emitting device of the first embodiment will be omitted when appropriate.

The light emitting device 300 includes a light emitting element 210, a wavelength converting member 220, a first conductive member 231, a second conductive member 232, and an insulating member 240. The width of the first conductive member 231 in the location that is connected to the light emitting element 210 is narrow, while the width of the first conductive member 231 in the location that is to be connected to an external electrode is broad. The first conductive member 231 and the second conductive member 232 are formed along both edges to the extent possible, while reducing the contact areas between the light emitting element 210 and the first and second conductive members 231, 232. Since the insulating member 240 is not in contact with the broad portions of the first conductive member 231 and the second conductive member 232, eliminating the need for considering the bondability of these members.

Fourth Embodiment

Figure 7:
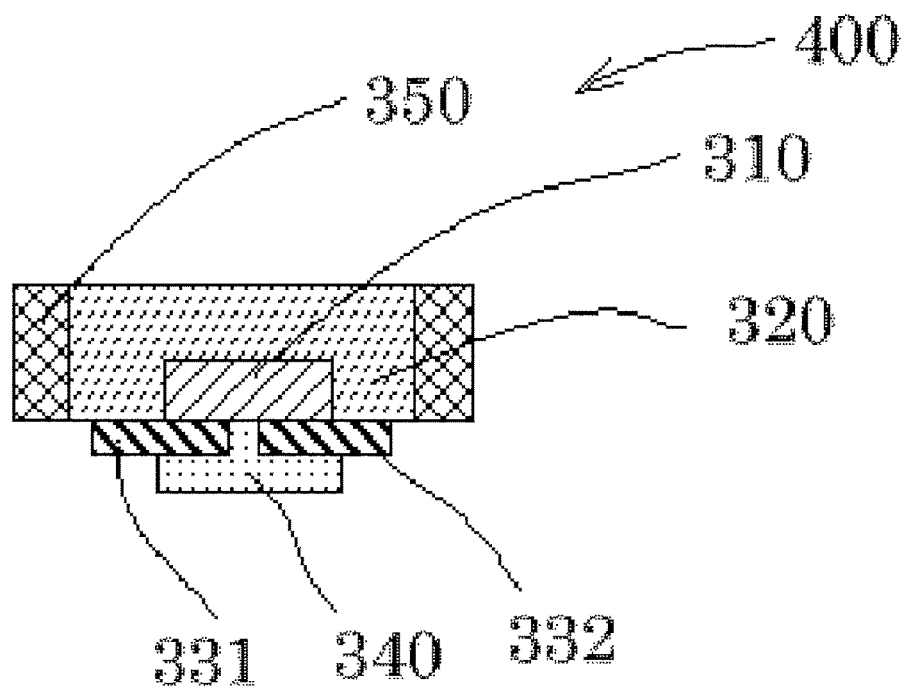
FIG. 7 is a schematic cross-sectional view of the light emitting device related to a fourth embodiment.

The light emitting device related to a fourth embodiment will be explained with reference to the drawing. FIG. 7 is a schematic cross-sectional view of the light emitting device related to the fourth embodiment. The light emitting device according to the fourth embodiment employs substantially the same construction as that of the first embodiment except for having a reflective member at the outer perimeter of the wavelength converting member. The explanations for the components that are substantially the same as those of the light emitting device of the first embodiment will be omitted when appropriate.

The light emitting device 400 includes a light emitting element 310, a wavelength converting member (a wavelength converting material) 320, a first conductive member (a first electrically conductive material) 331, a second conductive member (a first electrically conductive material) 332, an insulating member 340, and a reflective member (a reflective material) 350. The reflective member 350 covers the outer perimeter of the wavelength converting member 320 in a plan view. However, the reflective member 350 does not need to cover the entire perimeter of the wavelength converting member 320 in a plan view; for example, it can be provided along two opposing sides, or along one side only.

The reflective member 350 can be formed with a resin or glass containing a pigment, such as titanium oxide, aluminum oxide, silica, or the like. The height of the reflective member 350 is not specifically limited, but is preferably the same as that of the wavelength converting member 320. The thickness of the reflective member 350 is not specifically limited, but is preferably a thickness that can efficiently reflect the light laterally emitted from the light emitting element 310 towards the top or the like.

Fifth Embodiment

Figure 8:
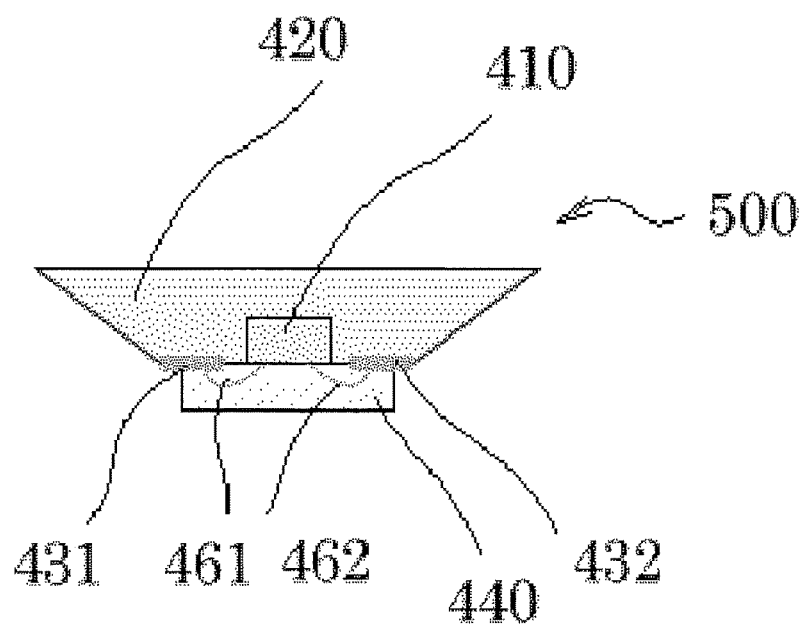
FIG. 8 is a schematic cross-sectional view of the light emitting device related to a fifth embodiment.
Figure 9A:
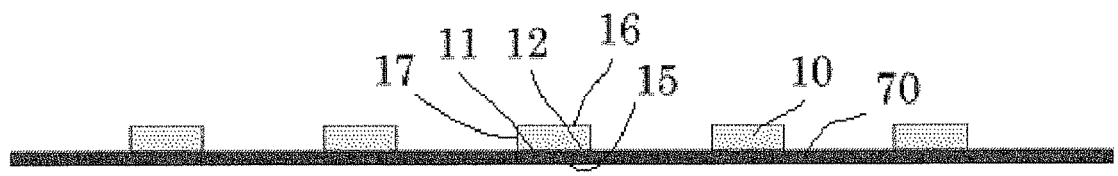
FIG. 9A is a schematic cross-sectional view showing part of a manufacturing step for the light emitting device related to the first embodiment.
Figure 9B:
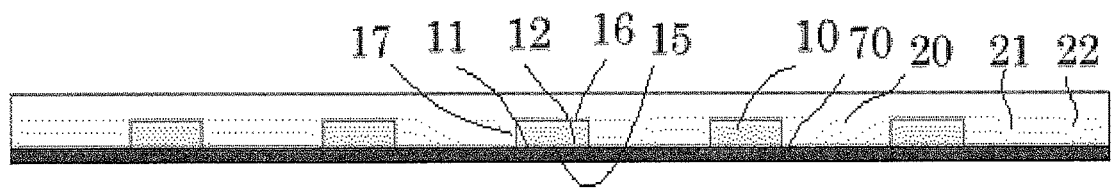
FIG. 9B is a schematic cross-sectional view showing part of a manufacturing step for the light emitting device related to the first embodiment.
Figure 9C:
FIG. 9C is a schematic cross-sectional view showing part of a manufacturing step for the light emitting device related to the first embodiment.
Figure 9D:
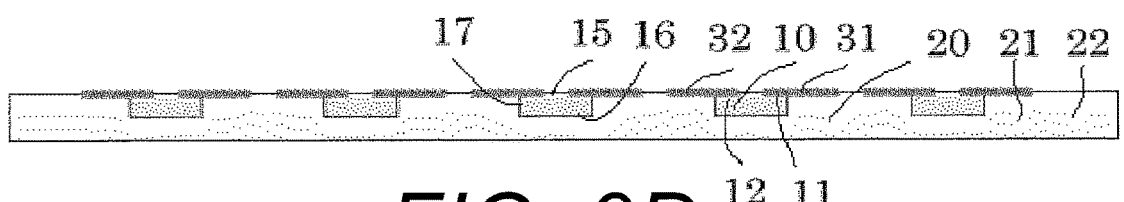
FIG. 9D is a schematic cross-sectional view showing part of a manufacturing step for the light emitting device related to the first embodiment.
Figure 9E:
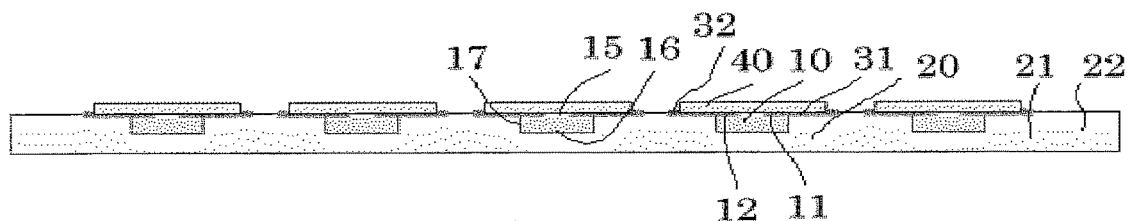
FIG. 9E is a schematic cross-sectional view showing part of a manufacturing step for the light emitting device related to the first embodiment.
Figure 9F:
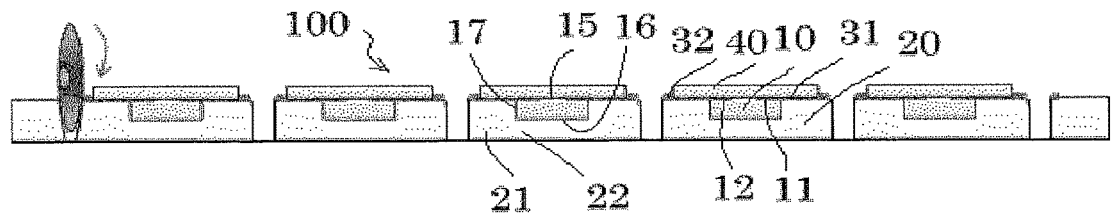
FIG. 9F is a schematic cross-sectional view showing part of a manufacturing step for the light emitting device related to the first embodiment.

The light emitting device related to a fifth embodiment will be explained with reference to the drawing. FIG. 8 is a schematic cross-sectional view of the light emitting device related to the fifth embodiment. The light emitting device according to the fifth embodiment employs substantially the same construction as that of the first embodiment except for connecting the light emitting element to the first conductive member and the second conductive member using wires and having a differently shaped wavelength converting member. The explanations for the components that are substantially the same as those of the light emitting device of the first embodiment will be omitted when appropriate.

The light emitting device 500 includes a light emitting element 410, a wavelength converting member (a wavelength converting material) 420, a first conductive member (a first electrically conductive material) 431, a second conductive member (a second electrically conductive material) 432, an insulating member 440, a first wire 461, and a second wire 462. The light emitting element 410 includes a first electrode 411 and a second electrode 412. The first electrode 411 is electrically connected to the first conductive member 431 via the first wire 461, and the second electrode 412 is electrically connected to the second conductive member 432 via the second wire 462. The first wire 461 and the second wire 462 are covered by the insulating member 440 over their entire surfaces. The thickness of the insulating member 440 is increased in proportion to the presence of the first wire 461 and the like.

The first electrode 411 and the first conductive member 431 may be formed spaced apart. This can reduce the surface area of the first conductive member 431.

Each component or member will be explained in detail below.

Light Emitting Element

The light emitting element is a light source in the light emitting device, and is, for example, a light emitting diode (LED). A light emitting element which emits light of a given wavelength can be selected, and a blue light emitting element having a peak emission wavelength ranging from 430 to 475 nm is preferable. For the light emitting element, for example, a nitride-based semiconductor expressed as $In_XAl_YGa_{1-X-Y}N$ (0≤X, 0≤Y, X+Y<1) can be used. The light emitting element is designed to emit blue light having a peak wavelength of $\lambda_0$=450 nm, and the peak wavelength of the light actually emitted $\lambda$ is the same value as the design value $\lambda_0$ or a value in the vicinity.

The shape of the light emitting element in a plan view is not limited to a square or rectangle, but also can be any polygon, such as a triangle, pentagon, hexagon, or the like.

Releasable Base Material

The releasable base material 70 is a sheet, substrate, or the like, having a tacky surface that can hold the light emitting element 10 in place when simply placed thereon, and easily lose the tackiness when heated or irradiated with UV rays to detach the light emitting element 10 and the wavelength converting member 20. Specifically, it is preferable to use a sheet prepared by coating the surface of a resin film such as polyester with a rubber-based bonding agent containing microcapsules expandable by heat or a sheet coated with an acrylic-based bonding agent which hardens and loses adhesion when irradiated with UV rays. In place of a resin film, a hard plastic sheet, metal sheet, ceramic sheet or the like can be used.

Wavelength Converting Member

For the wavelength converting member, a light transmissive member containing a phosphor can be used. The wavelength converting member may be composed of a phosphor alone.

The light transmissive member can be an insulating material that transmits light, a resin such as a thermosetting resin, thermoplastic resin, or the like, or an inorganic material, such as glass. Among thermosetting resins, for example, silicone resins, modified silicone resins, silyl modified silicone resins, epoxy resins, urea resins, or the like, can be used. In order to impart flexibility to the light emitting device, a material having a flexural modulus after adding the phosphor not exceeding 1000 MPa can be used. Among thermoplastic resins, polyphthalamide, polybutylene terephthalate, liquid crystal polymer, or the like is used. Among inorganic materials, soda-lime glass, borosilicate glass, quartz glass, or the like is used.

Examples of the phosphors include, cerium-activated yttrium aluminum garnet-based phosphors (YAG) which emit green to yellow light; cerium-activated lutetium aluminum garnet-based phosphors (LAG) which emit green light; europium- and/or chromium-activated nitrogen-containing calcium aluminosilicate-based phosphors ($CaO-Al_2O_3-SiO_2$) which emit green to red light; europium-activated silicate-based phosphors (($Sr,Ba)_2SiO_4$) which emit blue to red light; β-SiAlON phosphors having a composition expressed as $(Si,Al)_6(O,N)_8$:Eu and sulfide-base phosphors having a composition expressed as $SrGa_2S_4$:Eu, which emit green light; nitride-based phosphors, such as CASN-based phosphors having a composition expressed as $CaAlSiN_3$:Eu, SCASN-based phosphors having a composition expressed as $(Sr,Ca)AlSiN_3$:Eu or the like, which emit red light; fluoride-based phosphors, such as KSF-based phosphors having a composition expressed as ($K_2SiF_6$:Mn) or the like, which emit red light; sulfide phosphors which emit red light; and germanate-based (MGF-based) phosphors having a composition expressed as ($3.5MgO0.5MgF_2GeO_2$:Mn) which emit red light.

It is preferable to use a phosphor having an average particle diameter of about 1 to 4 μm, more preferably about 5 to 30 μm. Moreover, for the phosphor, nanoparticles having an average particle sized of under 1 μm can alternatively be used.

In a plan view, the wavelength converting member is not limited to a quadrilateral shape, such as a square or rectangle, but also a polygon such as a triangle, pentagon, hexagon, or the like. Moreover, the wavelength converting member may have a similar shape to the shape of the light emitting element.

First Conductive Member and Second Conductive Member

For the first conductive member and the second conductive member, a conductive paste prepared by dispersing metal powder of, for example, gold, silver, copper, aluminum, or the like in a resin material or solvent can be used. For the resin material, a silicone resin, modified silicone resin, silyl modified silicone resin, epoxy resin, urea resin, or the like can be used. It is preferable for the first conductive member and the second conductive member to have a constant thickness, but the thickness may vary. A combination of bumps and a thin film of gold, silver, copper, solder, or the like may be used for the connection with the light emitting element.

Insulating Member

For the insulating member, a resin, such as a thermosetting resin, thermoplastic resin, or the like, or an inorganic material, such as glass or the like, can be used. Among thermosetting resins, for example, a silicone resin, modified silicone resin, silyl modified silicone resin, epoxy resin, urea resin, or the like is used. Among thermoplastic resins, polyphthalamide, polybutylene terephthalate, liquid crystal polymer, or the like is used. Among inorganic materials, soda-lime glass, borosilicate glass, quartz glass, or the like is used. However, it is preferable to employ a silicone resin or glass which is highly thermally resistant. Moreover, the insulating member may be one prepared by adding a reflective material in a resin or the like to impart reflectance. Furthermore, the insulating member may alternatively be a metal member having a coating of an insulating material on the surface. Using a metal member can increase the thermal conductivity.

Reflective Member

For the reflective member, a resin such as a thermosetting or thermoplastic resin, or an inorganic material such as glass can be used. Among thermosetting resins, for example, a silicone resin, modified silicone resin, silyl modified silicone resin, epoxy resin, urea resin, or the like is used. Among thermoplastic resins, polyphthalamide, polybutylene terephthalate, liquid crystal polymer, or the like is used. Among inorganic materials, soda-lime glass, borosilicate glass, quartz glass, or the like is used. However, it is preferable to employ a silicone resin or glass which is highly thermally resistant. For the reflective member, it is preferable to use a thermosetting resin or the like which contains a reflective substance. For the reflective substance, Ti, Zr, Nb, Al, or Si oxide, or AlN, $MgF_2$, BN, or the like can be used, among which titanium oxide is preferable.

Other

The wavelength converting member may contain a reflective substance or light shielding material in addition to a phosphor. The dispersion of light from the light emitting element can be improved by including the reflective substance. Moreover, inclusion of a light shielding material can prevent the wavelength converting member from shining when irradiated with external light.

For the wires, gold, silver, copper, aluminum, or their alloys can be used.

Method for Manufacturing Light Emitting Device According to First Embodiment A method for manufacturing the light emitting device related to the first embodiment will be explained with reference to the drawings. FIGS. 9A to 9F are schematic cross-sectional views of certain steps in the method for manufacturing the light emitting device related to the first embodiment.

(a) A light emitting element 10, which has a first face 15 equipped with a first electrode 11 and a second electrode 12, a second face 16 opposing the first face 15, and lateral faces 17, and a releasable base material 70 are used. The light emitting element 10 is placed so that the first face 15 is in contact with the releasable base material 70.

Using multiple pieces of light emitting elements 10 can increase the production efficiency although a single piece may be used. The light emitting elements 10 are arranged on the releasable base material in multiple rows and columns at equal intervals.

It is preferable to use a tacky polyester film for the releasable base material 70, but a prescribed resin, inorganic material, substrate, or metal plate may alternatively be used.

Figure 12:
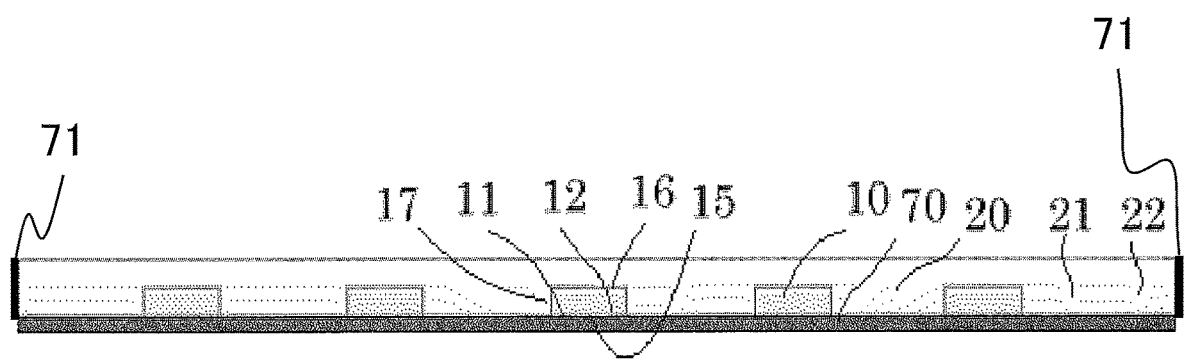
FIG. 12 is a schematic cross-sectional view showing part of a manufacturing step for the light emitting device related to the first embodiment.

A frame 71 may be arranged on the releasable base material 70 so as to surround the light emitting elements placed on the releasable base material 70 for disposing a wavelength converting member 20 on the light emitting elements surrounded by the frame 71 or on the releasable base material 70. The frame may be designed to individually or collectively surround the light emitting elements 10 arranged on the releasable base material 70. FIG. 12 shows the frame 71 designed to collectively surround the light emitting elements 10 arranged on the releasable base material 70. Providing a frame 71 makes it easier to adjust the height of the wavelength converting member 20. In the case of individually surrounding the light emitting elements 10, the frames 71 can be subsequently cut and used as a reflective member. It is preferable to use a sheet shaped resin, inorganic material, metal or the like having a through hole for the frame 71. The resin, inorganic material, or the like preferably contains a reflective substance in the case of using the frame 71 as a reflective member.

In placing the light emitting elements 10 on the releasable base material 70, releasable base materials may be attached to the first face 15 and the second face 16 of the light emitting elements 10 to join them together.

(b) The second face 16 and the lateral faces 17 of the light emitting elements 10 are covered with a wavelength converting member 20.

The wavelength converting member 20 before hardening or solidifying has fluidity, and spreads over the light emitting elements 10 and the releasable base material 70. The wavelength converting member 20 will not infiltrate between the light emitting element 10 and the releasable base material 70, never adhering to the first face of the light emitting element 10.

(c) Once the wavelength converting member 20 is hardened or solidified, the light emitting elements 10 covered with the wavelength converting member 20 are detached from the releasable base material 70.

It is preferable to employ a silicone resin having tackiness for the resealable base material 70 because no material composing the releasable base material 70 will remain on the light emitting elements 10. Detaching the light emitting elements 10 from the releasable base material 70 makes the first face 15 of the light emitting elements 10 and the lower face of the wavelength converting member 20 coplanar.

(d) A first conductive member 31, which covers at least a portion of the first electrode 11 and an upper portion of the wavelength converting member 20, is formed so as to be connected to the first electrode 11 of the light emitting element 10. Similarly, a second conductive member 32, which covers at least a portion of the second electrode 12 and an upper portion of the wavelength converting member 20, is formed so as to be connected to the second electrode 12 of the light emitting element 10. The first conductive member 31 and the second conductive member 32 are preferably formed substantially simultaneously in the same step. The surface areas of the first conductive member 31 and the second conductive member 32 in a plan view are each larger than the surface area of the light emitting element 10. As such, the first conductive member 31 or the like having a larger area than the light emitting element 10 can be provided in a simplified manner. This allows the heat generated by the light emitting element 10 and the wavelength converting member 20 to be externally released efficiently.

Here, it is preferable to mask the first face 15 of the light emitting element 10 covered with the wavelength converting member 20 so as to expose the first electrode 11 and the second electrode 12 of the light emitting element 10, followed by forming the first conductive member 31 and the second conductive member 32 on the exposed first electrode 11 and the exposed second electrode 12, respectively. This can highly precisely form the first conductive member 31 or the like having a prescribed shape in a simplified manner. The mask can be provided by forming a photoresist film and creating openings in the film at prescribed locations by exposure to a laser or the like and rinsing. Alternatively, a metal sheet or resin sheet having prescribed through holes may be used.

After forming the first conductive member 31 and the second conducive member 32, the mask is preferably removed. In the case where a photoresist is used for the mask, the photoresist can be removed by rinsing the photoresist again. In the case where a metal sheet or the like is used, the metal sheet or the like can be removed by detaching it.

As a method other than those that employ a mask, the first electrode 11 and the second electrode 12 of the light emitting element 10 can be coated with the raw materials for the first conductive member 31 and the second conductive member 32 in the form of particles, liquid, or semi-liquid, respectively, for example, by inkjet printing. This requires no mask formation or removal, thereby forming the first conductive member 31 or the like in a simplified manner.

The first conductive member 31 can be printed using a conducive ink.

(e) An insulating member 40 is disposed on at least part of the first conductive member 31, at least part of the second conductive member 32, and the first face 15 between the first electrode 11 and the second electrode 12. For the insulating member 40, a printing method employing a mask, or coating method can be used. For the insulating member, an insulating resin paste containing a reflective substance can be used. By using an insulating member 40 in a liquid form prior to hardening or solidifying, and placing a mask having openings at prescribed locations over the first electrode 11, the second electrode 12, and the wavelength converting member 20, the light transmissive member 22 containing a phosphor 21 [insulating member 40?] is formed by screen printing.

The insulating member 40 can be formed in a simplified manner by removing the mask when the light transmissive member 22 [insulating member 40?] is hardened or solidified. Even when there is a height difference between the wavelength converting member 20 and the first electrode 11 or the second electrode 12, moreover, an insulating member 40 having a prescribed thickness can be provided in a simplified manner. The insulating member 40 can alternatively formed by coating the insulating member 40 in a liquid form prior to hardening or solidifying. This can reduce production time because no mask is required.

(f) The wavelength converting member 20 on which multiple light emitting elements 10 are arranged is cut into individual pieces. A dicer, cutter, or the like is used for the cutting. It is preferable that the first conductive member 31, the second conductive member 32, or the insulating member 40 is not located in the cutting positions. In this manner, the cutting can be performed by using a dicer or cutter suited for the hardness of the wavelength converting member 20. Furthermore, this eliminates the necessity to take the ductility of the metal members such as the first conductive member 31 into consideration.

The light emitting device related to the first embodiment can be manufactured in a simplified manner by following the steps described above.

Method for Manufacturing Light Emitting Device According to Fifth Embodiment

The explanations of the same components as those in the light emitting device related to the first embodiment might be omitted when appropriate.

The steps (a) to (c) described above are similar to those in the first embodiment.

(d1) A first conductive member 431 and a second conductive member 432 are formed so that each cover an upper portion of the wavelength converting member 420. This process is similar to the first embodiment except for the difference in the locations where the first conductive member 431 and the second conductive member 432 are formed; the mask can similarly be formed by using a coating method. The surface areas of the first conductive member 431 and the second conductive member 432 in a plan view are each larger than the surface area of the light emitting element 410.

(d2) The first electrode 411 of the light emitting element 410 and the first conductive member 431 are connected using a first wire 461, and the second electrode 412 of the light emitting element 410 and the second conductive member 432 are connected using a second wire 462. It is preferable to first connect the first wire 461 to the first electrode 411 of the light emitting element 410, followed by connecting it to the first conductive member 431. The first wire 461 is not limited to a single wire, and multiple pieces of wires can be used instead. The same is true for the second wire 462.

(e1) An insulating member 440 is disposed to cover the first wire 461 and the second wire 462 around the entire circumference, at least part of the first conductive member 431, at least part of the second conductive member 432, and the first face between the first electrode 411 and the second electrode 412. The insulating member 440 can be formed in a similar manner to that in the first embodiment, i.e., using a mask or coating means, except for the differences in the thickness and the locations of the insulating member 440. In forming the insulating member 440, the mask or coating means is used so as not to disconnect the first wire 461 or the second sire 462. In order to reduce the opportunities of disconnecting the first wire 461 or the like, a mask utilizing photoresist is preferably employed.

The light emitting device related to the fifth embodiment can be manufactured by following the steps described above.

EXAMPLES

Examples 1 and 2

Figure 10A:
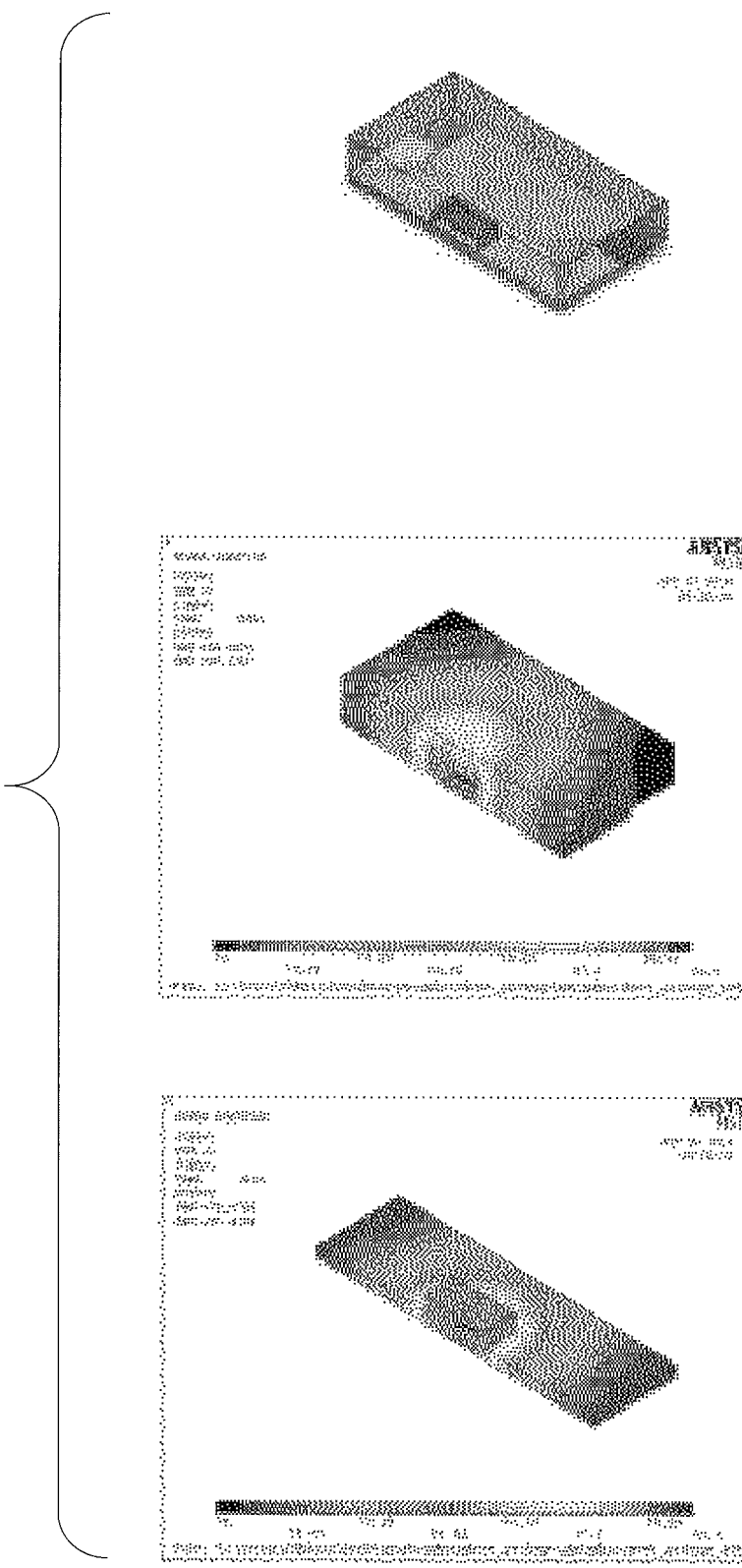
FIG. 10A includes schematic perspective views and the thermal history of the light emitting device related to Example 1.
Figure 10B:
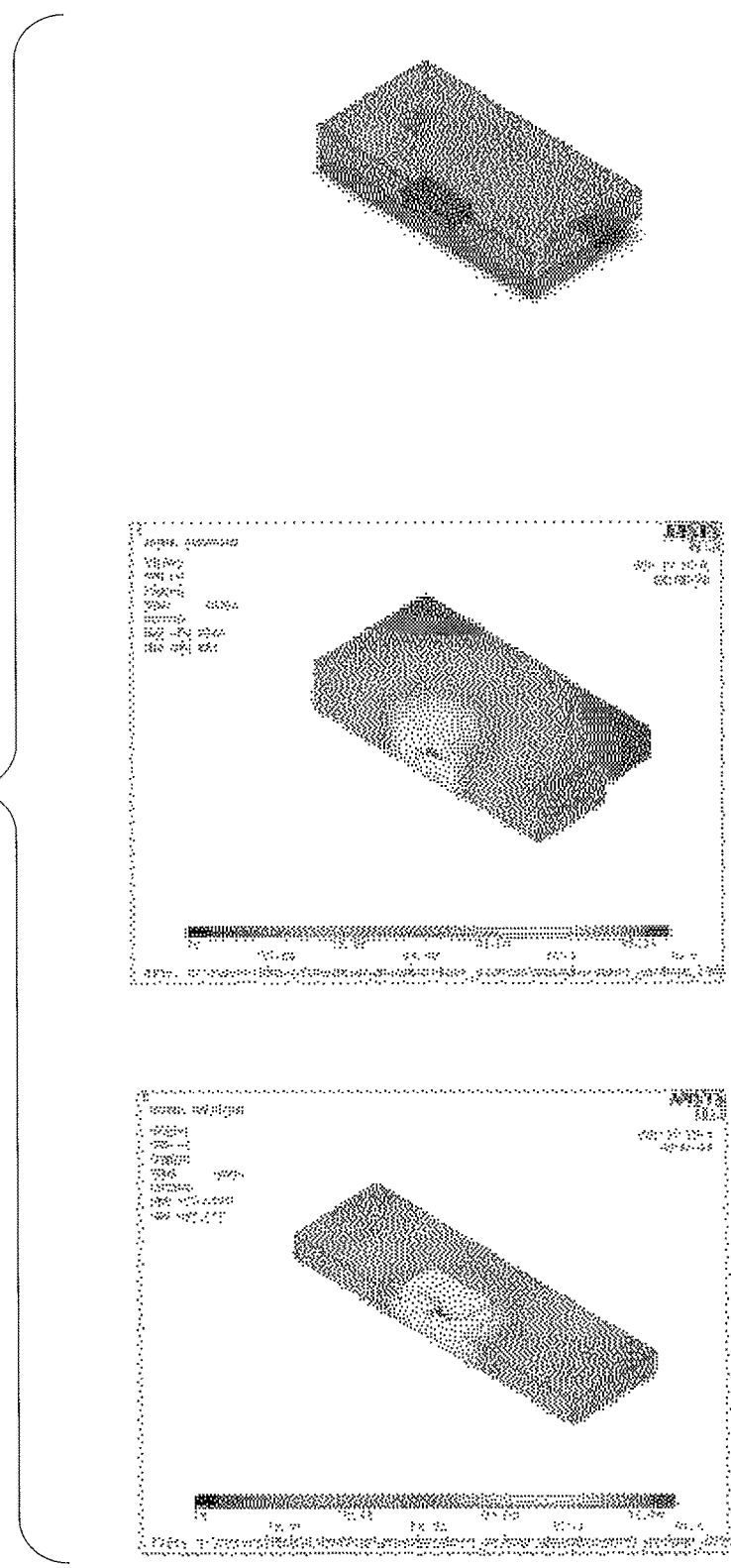
FIG. 10B includes schematic perspective views and the thermal history of the light emitting device related to Example 2.
Figure 10C:
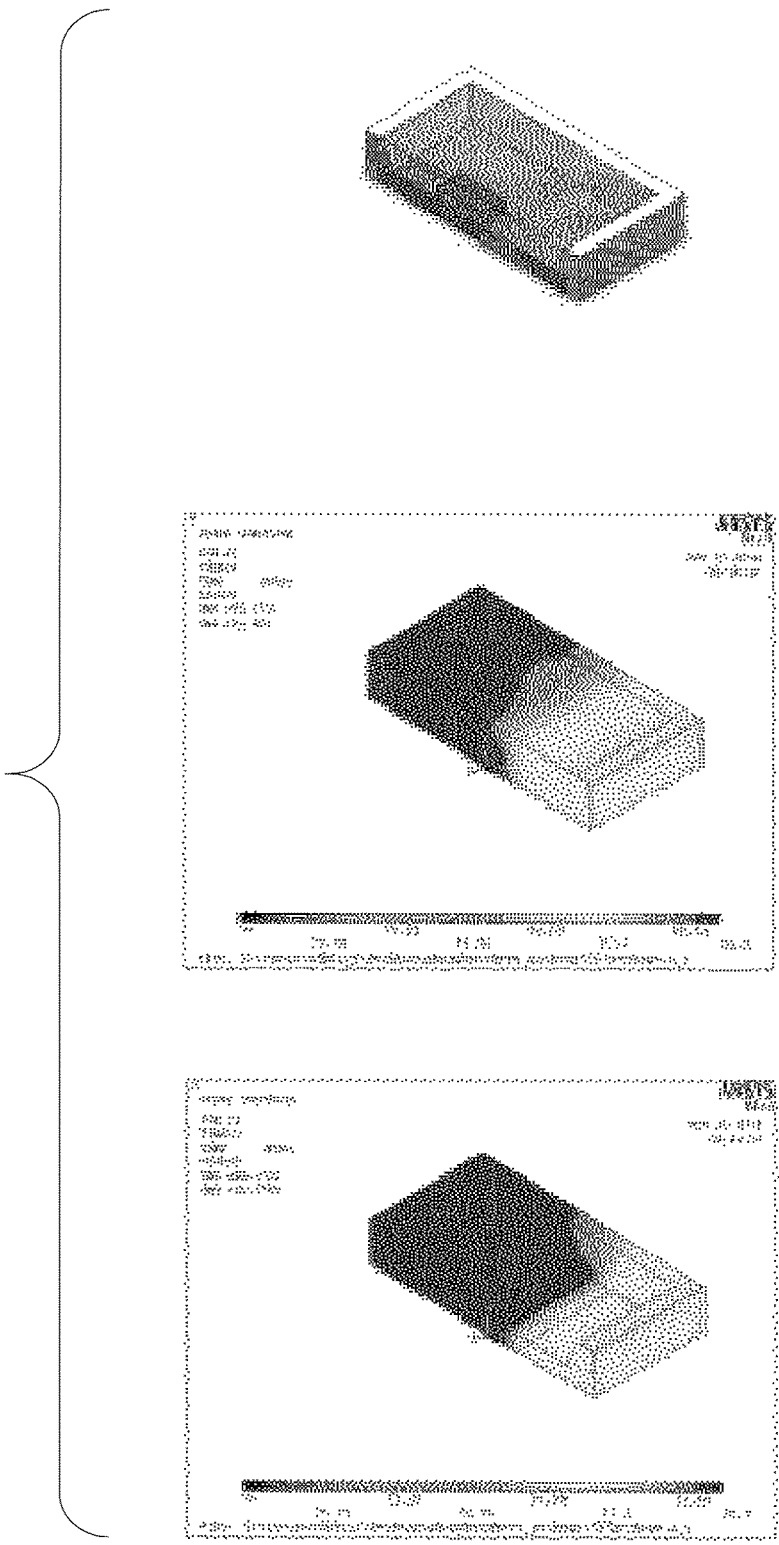
FIG. 10C includes schematic perspective views and the thermal history of the light emitting device related to Comparative Example 1.
Figure 11:
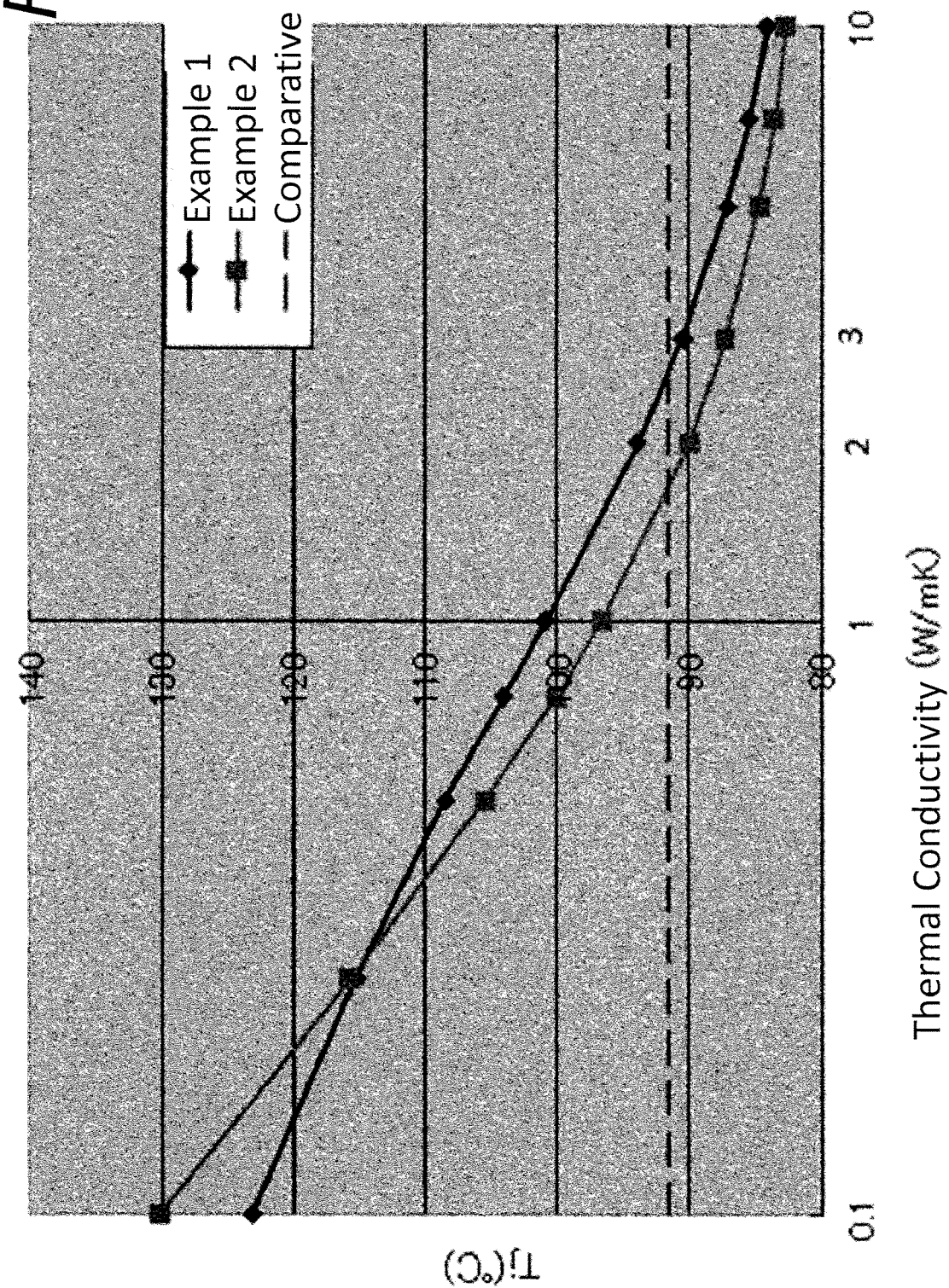
FIG. 11 is a graph showing the junction temperatures in the light emitting devices of Examples 1 and 2, and Comparative Example 1.

Light emitting devices related to Examples 1 and 2, and Comparative Example 1 will be explained with reference to the drawings. FIG. 10A includes schematic perspective views and the thermal history of the light emitting device related to Example 1. FIG. 10B includes schematic perspective views and the thermal history of the light emitting device related to Example 2. FIG. 10C includes schematic perspective views and the thermal history of the light emitting device related to the Comparative Example 1. FIG. 11 is a graph showing the junction temperatures of the light emitting devices of Examples 1 and 2, and Comparative Example 1. The light emitting devices of Examples 1 and 2 are generally the same as the light emitting device related to the first embodiment.

The light emitting devices 100 related to Examples 1 and 2 each include a light emitting element 10, a wavelength converting member 20, a first conductive member 31, a second conductive member 32, and an insulating member.

The light emitting element 10 is square shaped and 650 μm per side. The wavelength converting member 20 is square shaped, 3 mm per side, and 0.45 mm in thickness. The thickness of the insulating member 40 in Example 1 is 100 μm and the thickness of the insulating member 40 in Example 2 is 200 μm.

For Comparative Example 1, the NFSW757 package manufactured by Nichia Corporation was used. The light emitting element was the same as that used in Example 1.

Dissipation simulations were performed on the light emitting devices in Examples 1 and 2, and Comparative Example 1. The simulations were performed under the conditions described below. The amount of heat generated by the light emitting element was 32 mW and the ambient temperature was 25° C. The coefficient of heat transfer from the bottom face of the lead frame in the Comparative Example 1 and the bottom face of the insulating member in Examples 1 and 2 was 90 W/m$^2$K, and the coefficient of heat transfer of the other external surfaces was 5 W/m$^2$K. The thermal conductivity of the lead frame in Comparative Example 1 was 350 W/mK, and the thermal conductivity of the conductive members in Examples 1 and 2 was 40 W/mK.

The results show that the light emitting devices of Examples 1 and 2 generated heat at lower temperatures than the light emitting device of Comparative Example 1. In other words, the light emitting devices of Examples 1 and 2 were superior in terms of heat dissipation to the device of Comparative Example 1. This is because the package used in Comparative Example 1 has a lower thermal conductivity than the light emitting devices of Examples 1 and 2.

The light emitting device of Example 2 generated heat at even lower temperatures than the light emitting device of Example 1. This is because the thickness of the insulating member 20 contributed to heat dissipation.

The thermal conductivity and thickness of the insulating member 40 of a light emitting device affects the reduction of junction temperature (Tj). One can see that when the thermal conductivity of the insulating member 40 is improved, the Tj declines and the heat dissipation improves when the thickness of the insulating member 40 is either 100 μm or 200 μm. Furthermore, when the thermal conductivity of the insulating member 40 was low, 0.1 W/mK, the device having a 200 μm thick insulating member 40 had higher Tj than, and inferior heat dissipation to, the device having a 100 μm thick insulating member 40, indicating that in the case of a low thermal conductivity material, a larger thickness enhanced the thermal insulation. On the other hand, as the thermal conductivity of the insulating member 40 increased, the Tj of the device having a 200 μm thick insulation member 40 was lower than the device having a 100 μm thick insulating member, indicating that the heat dissipation from the lateral faces of the insulating member 40 becomes more difficult to be ignored. It can be assumed that when the thermal conductivity of the insulating member 40 reaches 1 W/mK, a similar Tj to that of the Comparative Example can be obtained by increasing the thickness of the insulating member 40. It was found that when the thermal conductivity of the insulating member 40 reaches 2 to 3 W/mK, heat dissipation equal to or better than that of the Comparative Example was achieved even with the 100 μm thick insulating member 40, which means that much better heat dissipation than that of the Comparative example can be achieved by increasing the thickness of the insulating member 40.

The light emitting devices related to the embodiments of the present disclosure can be used as light sources in various applications, including liquid crystal display backlights, various lighting fixtures, large displays, various display devices for advertisements and destination information boards, projectors, as well as image pickup devices for digital video cameras, facsimiles, copiers, and scanners.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a light emitting element having a first face on which a first electrode and a second electrode are provided;
   a wavelength converting member covering a whole of the light emitting element except for the first face such that a first surface of the wavelength converting member and the first face constitute a substantially flat plane;
   a first electrically conductive material having a first conductive material surface connected to the first face and the first surface of the wavelength converting member to be electrically connected to the first electrode and a second conductive material surface opposite to the first conductive material surface in a thickness direction perpendicular to the substantially flat plane;
   a second electrically conductive material having a third conductive material surface connected to the first face and the first surface of the wavelength converting member to be electrically connected to the second electrode and a fourth conductive material surface opposite to the third conductive material surface in the thickness direction; and
   an insulating member comprising:
   a first part disposed on the first electrically conductive material such that the first electrically conductive material is provided between the first part and the first face and is provided between the first part and the wavelength converting member, the first part having a first insulating member surface connected to a part of the second conductive material surface and a second insulating member surface opposite to the first insulating member surface in the thickness direction, the second insulating member surface being separated in the thickness direction from a remaining part of the second conductive material surface other than the part of the second conductive material surface;

a second part disposed on the second electrically conductive material such that the second electrically conductive material is provided between the second part and the first face and is provided between the second part and the wavelength converting member, the second part having a third insulating member surface connected to a part of the fourth conductive material surface and a fourth insulating member surface opposite to the third insulating member surface in the thickness direction, the fourth insulating member surface being separated in the thickness direction from a remaining part of the fourth conductive material surface other than the part of the fourth conductive material surface; and a third part integrated with the first part and the second part to contact the first face between the first electrode and the second electrode.

2. The light emitting device according to claim 1, wherein the light emitting element has
a second face opposite to the first face in a height direction along a height of the light emitting device and
a lateral face connecting the first face and the second face,
wherein the wavelength converting member covers the second face and the lateral face,
wherein the wavelength converting member has a second surface opposite to the first surface of the wavelength converting member and the first face in the height direction, and
wherein a height difference between a first height and a second height is 5 µm at most, the first height being a height between the first surface and the second surface in the height direction, the second height being a height between the first face and the second surface in the height direction.

3. The light emitting device according to claim 1, wherein the light emitting element has
a second face opposite to the first face in a height direction along a height of the light emitting device and
a lateral face connecting the first face and the second face,
wherein the wavelength converting member covers the second face and the lateral face,
wherein the wavelength converting member has an inner periphery surrounding the light emitting element viewed in the height direction and an outer periphery surrounding the inner periphery viewed in the height direction, and
wherein the outer periphery is covered with a reflective material viewed in the height direction.

4. The light emitting device according to claim 1, wherein the wavelength converting member has a flexural modulus of 1000 MPa at most.

5. The light emitting device according to claim 1, wherein the insulating member is disposed on a portion of the first electrically conductive material, and wherein the insulating member is disposed on a portion of the second electrically conductive material.

6. The light emitting device according to claim 1, wherein the light emitting element has
a second face opposite to the first face in a height direction along a height of the light emitting device and
a lateral face connecting the first face and the second face,
wherein the wavelength converting member covers the second face and the lateral face,
wherein the first electrically conductive material has
a first narrow portion having a first end connected to the first electrode and a second end opposite to the first end in a first direction perpendicular to the height direction, and
a first wide portion electrically connected to the second end of the first narrow portion such that the first wide portion does not overlap with the light emitting element when viewed in the height direction, the first narrow portion having a first portion width in a second direction perpendicular to the first direction and the height direction, the first wide portion having a second portion width larger than the first portion width in the second direction.

7. The light emitting device according to claim 6, wherein the light emitting element has an element width in the second direction,
wherein the first portion width is smaller than or equal to the element width of the light emitting element in the second direction, and
wherein the second portion width is larger than the element width of the light emitting element in the second direction.

8. The light emitting device according to claim 6, wherein the second electrically conductive material has
a second narrow portion having a third end connected to the second electrode and a fourth end opposite to the third end in the first direction and
a second wide portion electrically connected to the fourth end of the second narrow portion such that the second wide portion does not overlap with the light emitting element when viewed in the height direction, the second narrow portion having a third portion width in the second direction, the second wide portion having a fourth portion width larger than the third portion width in the second direction, and
wherein the second electrode is opposite to the first electrode in the first direction.

9. The light emitting device according to claim 6, wherein the second electrically conductive material has
a second narrow portion having a third end connected to the second electrode and a fourth end opposite to the third end in the first direction and
a second wide portion electrically connected to the fourth end of the second narrow portion such that the second wide portion does not overlap with the light emitting element when viewed in the height direction, the second narrow portion having a third portion width in the second direction, the second wide portion having a fourth portion width larger than the third portion width in the second direction, and
wherein the second electrode is opposite to the first electrode in the second direction.

10. The light emitting device according to claim 1, wherein the insulating member has a rectangular shape having four corners, and wherein neither the first electrically conductive material nor the second electrically conductive material overlaps with the insulating member at the four corners.

11. The light emitting device according to claim 1, wherein the light emitting element has
a second face opposite to the first face in a height direction along a height of the light emitting device and
a lateral face connecting the first face and the second face,
wherein the wavelength converting member covers the second face and the lateral face,
wherein the insulating member overlaps with entirety of the light emitting element as viewed in the height direction.

12. A light emitting device comprising:
a light emitting element having a first face on which a first electrode and a second electrode are provided;
a wavelength converting member covering a whole of the light emitting element except for the first face such that a first surface of the wavelength converting member and the first face constitute a substantially flat plane;
a first electrically conductive material having a first conductive material surface connected to the first surface of the wavelength converting member outside the first face to be electrically connected to the first electrode and a second conductive material surface opposite to the first conductive material surface in a thickness direction perpendicular to the substantially flat plane;
a second electrically conductive material having a third conductive material surface connected to the first surface of the wavelength converting member outside the first face to be electrically connected to the second electrode and a fourth conductive material surface opposite to the third conductive material surface in the thickness direction; and
an insulating member comprising:
a first part disposed on the first electrically conductive material such that the first electrically conductive material is provided between the first part and the first face and is provided between the first part and the wavelength converting member, the first part having a first insulating member surface connected to a part of the second conductive material surface and a second insulating member surface opposite to the first insulating member surface in the thickness direction, the second insulating member surface being separated in the thickness direction from a remaining part of the second conductive material surface other than the part of the second conductive material surface;
a second part disposed on the second electrically conductive material such that the second electrically conductive material is provided between the second part and the first face and is provided between the second part and the wavelength converting member, the second part having a third insulating member surface connected to a part of the fourth conductive material surface and a fourth insulating member surface opposite to the third insulating member surface in the thickness direction, the fourth insulating member surface being separated in the thickness direction from a remaining part of the fourth conductive material surface other than the part of the fourth conductive material surface; and
a third part integrated with the first part and the second part to contact the first face between the first electrode and the second electrode.

13. The light emitting device according to claim 12, further comprising:
a first wire connecting the first electrode and the first electrically conductive material, and
a second wire connecting the second electrode and the second electrically conductive material, the insulating material covering a whole of the first wire and the second wire.

14. The light emitting device according to claim 12, wherein the insulating member is disposed on a portion of the first electrically conductive material, and
wherein the insulating member is disposed on a portion of the second electrically conductive material.

15. The light emitting device according to claim 12, wherein the light emitting element has
a second face opposite to the first face in a height direction along a height of the light emitting device, and
a lateral face connecting the first face and the second face,
wherein the wavelength converting member covers the second face and the lateral face,
wherein the wavelength converting member has an inner periphery surrounding the light emitting element viewed in the height direction and an outer periphery surrounding the inner periphery viewed in the height direction, and
wherein the outer periphery is covered with a reflective material viewed in the height direction.

16. The light emitting device according to claim 12, wherein the wavelength converting member has a flexural modulus of 1000 MPa at most.

17. The light emitting device according to claim 12, wherein the light emitting element has
a second face opposite to the first face in a height direction along a height of the light emitting device and
a lateral face connecting the first face and the second face,
wherein the wavelength converting member covers the second face and the lateral face,
wherein the first electrically conductive material has
a first narrow portion having a first end connected to the first electrode and a second end opposite to the first end in a first direction perpendicular to the height direction, and
a first wide portion electrically connected to the second end of the first narrow portion such that the first wide portion does not overlap with the light emitting element when viewed in the height direction, the first narrow portion having a first portion width in a second direction perpendicular to the first direction and the height direction, the first wide portion having a second portion width larger than the first portion width in the second direction.

18. The light emitting device according to claim 17, wherein the light emitting element has an element width in the second direction,
wherein the first portion width is smaller than or equal to the element width of the light emitting element in the second direction, and
wherein the second portion width is larger than the element width of the light emitting element in the second direction.

19. The light emitting device according to claim 17,
wherein the second electrically conductive material has
- a second narrow portion having a third end connected to the second electrode and a fourth end opposite to the third end in the first direction and
- a second wide portion electrically connected to the fourth end of the second narrow portion such that the second wide portion does not overlap with the light emitting element when viewed in the height direction, the second narrow portion having a third portion width in the second direction, the second wide portion having a fourth portion width larger than the third portion width in the second direction, and wherein the second electrode is opposite to the first electrode in the first direction.

20. The light emitting device according to claim 17,
wherein the second electrically conductive material has
- a second narrow portion having a third end connected to the second electrode and a fourth end opposite to the third end in the first direction and
- a second wide portion electrically connected to the fourth end of the second narrow portion such that the second wide portion does not overlap with the light emitting element when viewed in the height direction, the second narrow portion having a third portion width in the second direction, the second wide portion having a fourth portion width larger than the third portion width in the second direction, and wherein the second electrode is opposite to the first electrode in the second direction.

21. The light emitting device according to claim 12,
wherein the insulating member has a rectangular shape having four corners, and
wherein neither the first electrically conductive material nor the second electrically conductive material overlaps with the insulating member at the four corners.

22. The light emitting device according to claim 12,
wherein the light emitting element has
- a second face opposite to the first face in a height direction along a height of the light emitting device and
- a lateral face connecting the first face and the second face, wherein the wavelength converting member covers the second face and the lateral face,
wherein the insulating member overlaps with entirety of the light emitting element as viewed in the height direction.

\* \* \* \* \*